US006965506B2

(12) United States Patent
Howald

(10) Patent No.: US 6,965,506 B2
(45) Date of Patent: Nov. 15, 2005

(54) SYSTEM AND METHOD FOR DECHUCKING A WORKPIECE FROM AN ELECTROSTATIC CHUCK

(75) Inventor: Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 658 days.

(21) Appl. No.: 10/126,832

(22) Filed: Apr. 18, 2002

(65) Prior Publication Data

US 2003/0038114 A1 Feb. 27, 2003

Related U.S. Application Data

(63) Continuation-in-part of application No. 09/163,368, filed on Sep. 30, 1998, now Pat. No. 6,790,375.
(60) Provisional application No. 60/322,580, filed on Sep. 14, 2001.

(51) Int. Cl.⁷ ............................................. H02N 13/00
(52) U.S. Cl. ....................................................... 361/234
(58) Field of Search ............................... 361/234, 230, 361/236; 438/716; 217/67

(56) References Cited

U.S. PATENT DOCUMENTS

| | | | |
|---|---|---|---|
| 4,724,621 A | 2/1988 | Hobson et al. | 39/218 |
| 5,103,367 A | 4/1992 | Horwitz et al. | 361/234 |
| 5,117,121 A | 5/1992 | Watanabe et al. | 307/130 |
| 5,179,498 A | 1/1993 | Hongoh et al. | 361/234 |
| 5,221,450 A | 6/1993 | Hattori et al. | 205/322 |
| 5,325,261 A | 6/1994 | Horwitz | 361/234 |
| 5,444,597 A | 8/1995 | Blake et al. | 361/234 |

(Continued)

FOREIGN PATENT DOCUMENTS

| | | |
|---|---|---|
| EP | 0 680 083 | 11/1995 |
| EP | 0 694 949 | 1/1996 |
| EP | 0 710 055 | 5/1996 |
| EP | 0 831 526 | 3/1998 |
| GB | 2 293 689 | 4/1996 |
| JP | 07 074231 | 3/1995 |
| WO | 97 12396 | 4/1997 |

OTHER PUBLICATIONS

Matsumoto et al., Effect of Heat Treatment on the Coefficient $\beta_{pf}$ for the Poole–Frenkel Effect and the Conductivity in $Ta_2O$ Films, Jan. 1980, Japanese Journal of Applied Physics, vol. 19, No. 1, pp. 71–77.

U.S. Appl. No. 09/163,368, entitled "Dechucking Method and Apparatus for Workpieces in Vacuum Processors," filed Sep. 30, 1998, inventors: Howald et al.

*Primary Examiner*—Brian Sircus
*Assistant Examiner*—Boris Benenson

(74) *Attorney, Agent, or Firm*—IP Strategy Group, PC

(57) ABSTRACT

The present invention comprises a system and method for determining the reverse voltage and time to apply to the dechucking of a workpiece from an electrostatic chuck (ESC). The system for dechucking comprises a processing chamber operatively coupled to a microprocessor and a memory that is configured to determine the dechucking parameters for the workpiece. The method for determining dechucking parameters comprises generating a correlation between ESC resistance and dechucking parameters, performing a single experimental test on a new ESC and generating a fitting parameter, and using the correlation and the fitting parameter to determine the dechucking parameters.

60 Claims, 9 Drawing Sheets

U.S. PATENT DOCUMENTS

| | | | |
|---|---|---|---|
| 5,459,632 A | 10/1995 | Birang et al. | 361/234 |
| 5,463,525 A | 10/1995 | Barnes et al. | 361/234 |
| 5,474,614 A | 12/1995 | Robbins | 118/728 |
| 5,491,603 A | 2/1996 | Birang et al. | 361/234 |
| 5,507,874 A | 4/1996 | Su et al. | 134/1 |
| 5,539,609 A | 7/1996 | Collins et al. | 361/234 |
| 5,552,955 A | 9/1996 | Mashiro et al. | 361/234 |
| 5,557,215 A | 9/1996 | Saeki et al. | 324/765 |
| 5,566,744 A | 10/1996 | Tepman | 165/80.1 |
| 5,573,981 A | 11/1996 | Sato | 437/225 |
| 5,612,850 A | 3/1997 | Birang et al. | 361/234 |
| 5,677,824 A | 10/1997 | Harashima et al. | 361/234 |
| 5,684,669 A | 11/1997 | Collins et al. | 361/234 |
| 5,699,223 A | 12/1997 | Mashiro et al. | 361/234 |
| 5,708,250 A | 1/1998 | Benjamin et al. | 219/121.58 |
| 5,708,556 A | 1/1998 | van Os et al. | 361/234 |
| 5,737,177 A | 4/1998 | Mett et al. | 361/234 |
| 5,764,471 A | 6/1998 | Burkhart | 361/234 |
| 5,793,192 A | 8/1998 | Kubly et al. | 323/312 |
| 5,818,682 A | 10/1998 | Loo | 361/234 |
| 5,838,528 A | 11/1998 | Os et al. | 361/234 |
| 5,847,918 A | 12/1998 | Shufflebotham et al. | 361/234 |
| 5,874,361 A * | 2/1999 | Collins et al. | 438/716 |
| 5,876,119 A * | 3/1999 | Ishikawa et al. | 374/134 |
| 5,880,924 A | 3/1999 | Kumar et al. | 361/234 |
| 5,894,400 A | 4/1999 | Graven et al. | 361/234 |
| 5,933,314 A | 8/1999 | Lambson et al. | 361/234 |
| 5,956,837 A | 9/1999 | Shiota et al. | 29/559 |
| 6,125,025 A | 9/2000 | Howald et al. | 361/234 |
| 6,163,448 A * | 12/2000 | Hausmann | 361/234 |
| 6,215,640 B1 * | 4/2001 | Hausmann | 361/234 |
| 6,236,555 B1 * | 5/2001 | Leeser | 361/234 |
| 6,307,728 B1 * | 10/2001 | Leeser | 361/234 |
| 6,430,022 B2 * | 8/2002 | Leeser | 361/234 |
| 6,489,776 B1 * | 12/2002 | Stowe et al. | 324/458 |

* cited by examiner

SYSTEM AND METHOD FOR DECHUCKING A WORKPIECE FROM AN ELECTROSTATIC CHUCK

CROSS REFERENCE

The present patent application is a Continuation-In-Part of patent application Ser. No. 09/163,368 that was filed on Sep. 30, 1998, now U.S. Pat. No. 6,790,375 and titled "Dechucking Method and Apparatus for Workpieces in Vacuum Processors". Additionally, the present patent application claims priority of provisional patent application 60/322,580 that was filed on Sep. 14, 2001 and is titled "A Dechucking Algorithm for Electrostatic Chucks With Voltage Polarity Reversal." These applications are hereby incorporated by reference.

BACKGROUND OF THE INVENTION

1. Field of Invention

The present invention is related to processing of dielectric or semiconductor materials. More particularly, the invention is related to releasing a dielectric or semiconductor workpiece from an electrostatic chuck.

2. Description of Related Art

During the process of wafer processing or glass processing, an electrostatic chuck (ESC) is used to clamp the semiconductor or dielectric workpiece to a metal holder. The ESC operates like a capacitor in that a static charge is built up between the workpiece and the metal holder to clamp or secure the workpiece on the metal holder. The process of semiconductor or dielectric processing deposits a substantial amount of power on the workpiece. In order to cool the workpiece during processing, a heat transfer medium is needed to transfer heat from the workpiece to a heat sink. The heat sink is the metal holder which has been water cooled. The heat transfer medium is a gas such as helium which is capable of transferring heat from the workpiece to the water-cooled metal holder. The ESC is the preferred clamping device to hold the workpiece against the metal holder.

Upon completion of the processing, the workpiece must be removed from the metal holder. A residual sticking force remains between the ESC and the workpiece after the clamping force has been turned off. The process of removing the workpiece due to this sticking force is referred to as "dechucking" or declamping the workpiece. The dechucking process is complicated by the variation in dechucking values for each individual ESC. Therefore, the dechucking values used for one ESC do not necessarily work for another ESC, even if each ESC is made by the same manufacturer using the same materials. Additionally, a single ESC has electrical properties that depend on temperature, so the dechucking values at one temperature do not necessarily work for the same ESC at a different temperature.

Prior art systems and methods for dechucking teach a variety of different dechucking methods. By way of example, Watanabe et al. in U.S. Pat. No. 5,117,121 teaches a dechucking apparatus that applies a reverse polarity voltage for a period of time. The patent teaches different dechucking voltages and dechucking time that may be stored in a computer for use with different values of the clamping voltage and for different durations of the clamping voltage. However, the patent fails to teach, inter alia, a method for determining the optimum dechucking parameters. Additionally, the patent fails to teach a system and method that accounts for the variability in the electrical properties for each ESC. Further still, the patent fails to address how the changes in temperature affect the dechucking process.

In U.S. Pat. No. 5,459,632, U.S. Pat. No. 5,612,850, and U.S. Pat. No. 5,491,603 Birang et al. describes a dechucking method in which an optimum dechucking value is determined that allows the workpiece to be removed from the chuck with much less force. Birang teaches an automatic method of establishing the dechucking voltage by connecting the chucking voltage supply between the chuck electrode and the semiconductor wafer while the wafer is some distance above the chuck, and then measuring the surge of current flow from the chucking voltage supply when the wafer is lowered on to the upper dielectric of the chuck. Furthermore, Birang teaches a method that determines the optimum dechucking voltage by reducing the applied potential on the ESC electrode from the relatively high chucking voltage downwardly in small steps while monitoring the leak rate of the helium beneath the wafer. However, Birang fails to teach an efficient system and method for calculating the dechucking voltage and time at various temperatures for a batch of ESCs. Additionally, Birang fails to teach the monitoring of the current when the workpiece is lifted from the chuck. Further still, Birang fails to teach a method to measure the chuck resistance.

In U.S. Pat. No. 5,793,192, Kubly et al. teaches the use of dechucking voltage for a dechucking period and provides a method for choosing the optimum dechucking values. The dechucking values of voltage and time are calculated by supplying various clamping voltages, and measurements are taken of the time it takes for the heat transfer gas to pop the wafer off the chuck. This method of calculating voltages and times is inefficient because each chuck must be analyzed individually at the various clamping voltages. Additionally, this method does not take into consideration temperature effects.

In U.S. Pat. No. 5,818,682, Loo teaches a method and an apparatus that predicts an optimal period over which a dechucking voltage is applied to an ESC to achieve dechucking of a workpiece. Loo teaches a dechucking period and dechucking voltage that is related to the chucking period, chucking voltage and a constant. Loo's method and apparatus fails to use temperature, chuck current, and chuck resistance for determining dechucking parameters of reverse voltage and time.

In U.S. Pat. No. 6,125,025, which is hereby incorporated by reference, Howald et al. teaches at least one method of dechucking. The method includes the process steps of reducing the voltage applied to the dielectric workpiece without reversing the polarity of the voltage via the electrode and insulator while workpiece processing proceeds. Another of the dechucking steps includes reversing the polarity of the DC voltage applied to the electrode upon completion of the workpiece processing. However, the method fails to teach the use of temperature and chuck resistance for determining dechucking parameters of reverse voltage and time.

Therefore, it would be beneficial to provide a system and method for dechucking that is simple to implement.

Additionally, it would be beneficial to provide a system and method for dechucking that takes into consideration the temperature effects on the ESC.

Further still, it would be beneficial to provide a system and method for dechucking that takes into consideration the electrical properties for each ESC.

Furthermore, it would be beneficial to provide a system and method for dechucking that is dependent on the unique properties associated with each ESC.

Further still, it would be beneficial to provide a system and method for dechucking that can be implemented for a batch of ESCs.

Further still, it would be beneficial to provide a system and method for dechucking that is not dependent on the length of time for which the chucking voltage is applied.

Further still, it would be beneficial to provide a system and method that can reliably model the ESC dechucking values.

Further still, it would be beneficial to provide a system and method for dechucking that can be implemented by programming an etch tool to perform the dechucking operations rather than present day methods that rely on the tool operator.

SUMMARY OF INVENTION

The illustrative plasma processor comprises an electrostatic chuck (ESC) that is communicatively coupled to a microprocessor. The microprocessor is also communicatively coupled to a plurality of sensors and valves. Further still the microprocessor is operatively coupled to a user interface.

The microprocessor is configured to either generate or, in combination with a memory, store a correlation between an ESC electrical property, e.g. ESC resistance, and dechucking parameters. A dechucking parameter includes a reverse polarity voltage for dechucking a workpiece from an ESC and a time period for applying the reverse polarity voltage. Further still, the microprocessor is configured to receive data related to a new ESC that is subject to a single experimental test, and then calculate a fitting parameter. Finally, the microprocessor is configured to calculate an approximate dechucking parameter for the new ESC with the fitting parameter and the correlation.

The method for determining dechucking parameters comprises three steps. The first step comprises generating a correlation between an ESC electrical property and dechucking parameters. The second step comprises performing a single experimental test on a new ESC and generating a fitting parameter. The third step includes using the correlation and the fitting parameter to predict the operating properties of the new ESC.

More particularly, the first step for generating a correlation between the ESC electrical property and dechucking comprises measuring the ESC electrical property for a plurality of ESCs at a plurality of different temperatures. Dechucking voltage and dechucking time are then measured for each of the plurality of ESCs. A correlation between the dechucking parameters and the ESC resistance is then generated.

The second step comprises selecting a new ESC and performing a single experimental test. After the single experimental test is performed a fitting parameter that is unique to the new ESC is calculated.

The third step comprises predictively determining the dechucking parameters of the new ESC with the fitting parameter generated in the second step and the correlation generated in the first step.

To measure the ESC electrical property a reliable system and method must be used. In one illustrative embodiment, the ESC electrical property is ESC resistance that is measured in situ. The system for measuring the ESC resistance includes a processing chamber configured to generate a plasma and adapted to receive a workpiece. The method for measuring the ESC resistance provides for the measuring of current for the ESC and determining the ESC resistance based on the measured ESC current. Alternatively, ESC resistance may be measured in a test chamber and using a conductive material placed on the ESC. The in situ system and method for measuring ESC resistance is more efficient than the alternative. Other ESC electrical properties may also be measured and include ESC current, ESC impedance, and ESC capacitance. To measure the dechucking parameters, a first estimated dechucking parameter is employed. Then the workpiece is lifted from the ESC, and the ESC current is measured to determine if there is a current spike. If there is a current spike associated with the lifting of the workpiece from the ESC, then the dechucking parameters are modified until the magnitude of the current spike is minimized. In one illustrative embodiment, if the current spike measured displays a positive ESC current, then the dechucking parameters were too high. In another illustrative embodiment, if the current spike measured displays a negative ESC current, then the dechucking parameters were too low. In operation, the dechucking parameters are modified until the magnitude of the current spike has been minimized. The final dechucking parameters are then used in generating the correlation between the ESC electrical property and the dechucking parameters.

BRIEF DESCRIPTION OF THE DRAWINGS

Preferred embodiments of the present invention are shown in the accompanying drawings wherein.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

This invention provides a system and method for determining the dechucking parameters for an electrostatic chuck (ESC). During the dechucking process a reverse polarity voltage is applied for a time period. It shall be appreciated by those skilled in the art that during the dechucking process that if the reverse polarity magnitude is too small or the time period too short, the workpiece will not be sufficiently dechucked and may stick to the ESC. On the other hand, if the reverse polarity magnitude is too high or the time too long, the wafer may be re-clamped with the opposite polarity, and once again may stick to the ESC.

The present invention comprises a system and method for dechucking that takes into consideration the variation in electrical properties for ESCs, the temperature effects associated with each ESC, and a method that allows for the predictive and reliable modeling of ESC properties during the dechucking process. For purposes of this patent the term "dechucking parameters" is used to refer to the magnitude of the reverse polarity voltage and the time period for applying the reverse polarity voltage.

To more clearly describe the invention this description is divided into four sections. The first section describes an illustrative etch tool apparatus or system on which the dechucking method takes place. The second section describes the method for calculating the dechucking parameters for an ESC. The third section describes an illustrative method used to measure an ESC electrical property. The ESC electrical property is used to calculate the dechucking parameters. The fourth section describes the method for measuring the dechucking parameters. The distinction between the second section's "calculating" the dechucking parameters is substantially different from the "measuring" of dechucking parameters. The term "measuring" refers to the experimental measuring of the dechucking parameters that are used to generate a correlation. The correlation is used to "calculate" the dechucking parameters for the ESC.

1. Illustrative Plasma Processor for Dechucking

Figure 1:
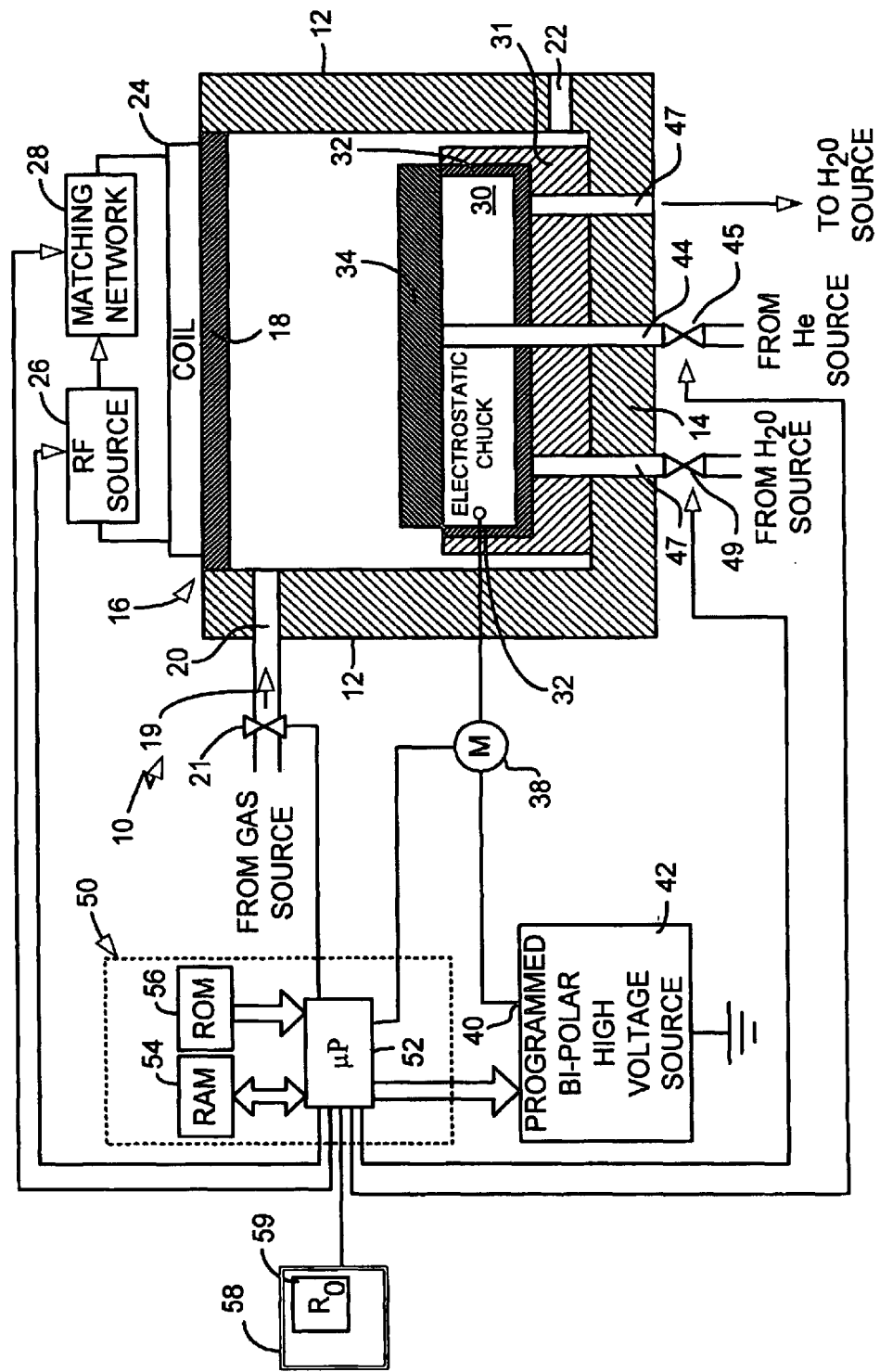
FIG. 1 is an illustrative embodiment comprising an electrostatic chuck (ESC) in a processing chamber that is communicatively coupled to a microprocessor.

An illustrative plasma processing system capable of chucking and dechucking a workpiece is described infra. Referring to FIG. 1, there is shown an illustrative plasma processor that can be used for etching a workpiece or for depositing films on the workpiece in a chamber 10 having sidewalls 12. The chamber 10 is a vacuum chamber which includes a bottom end plate 14 and top end plate structure 16 with a dielectric window 18. Sealing of these exterior surfaces is provided with conventional gaskets (not shown).

A suitable gas that can be excited to a plasma is supplied to the interior of chamber 10 from a gas source (not shown) via line 19, port 20 and valve 21. A plasma is an electrically neutral, highly ionized gas composed of ions, electrons, and neutral particles. The interior of chamber 10 is maintained in a vacuum condition by a vacuum pump connected to port 22 in sidewall 12. It shall be appreciated by those of ordinary skill in the art that the port 22 may also be located at the bottom of the chamber. The gas in vacuum chamber 10 is excited to a plasma condition by a suitable electric source, such as planar coil 24, mounted above window 18 and excited by RF source 26 via matching network 28.

An illustrative electrostatic chuck (ESC) 30 is fixedly mounted in chamber 10 on support structure including grounded metal base 31 that is electrically decoupled from the chuck by electrical insulating sheets 32; base 31 is fixed to bottom end plate 14. ESC 30 is particularly designed to selectively hold workpiece 34. Generally, the workpiece 34 is either a semiconductor wafer or a glass dielectric or any combination thereof.

Figure 2:
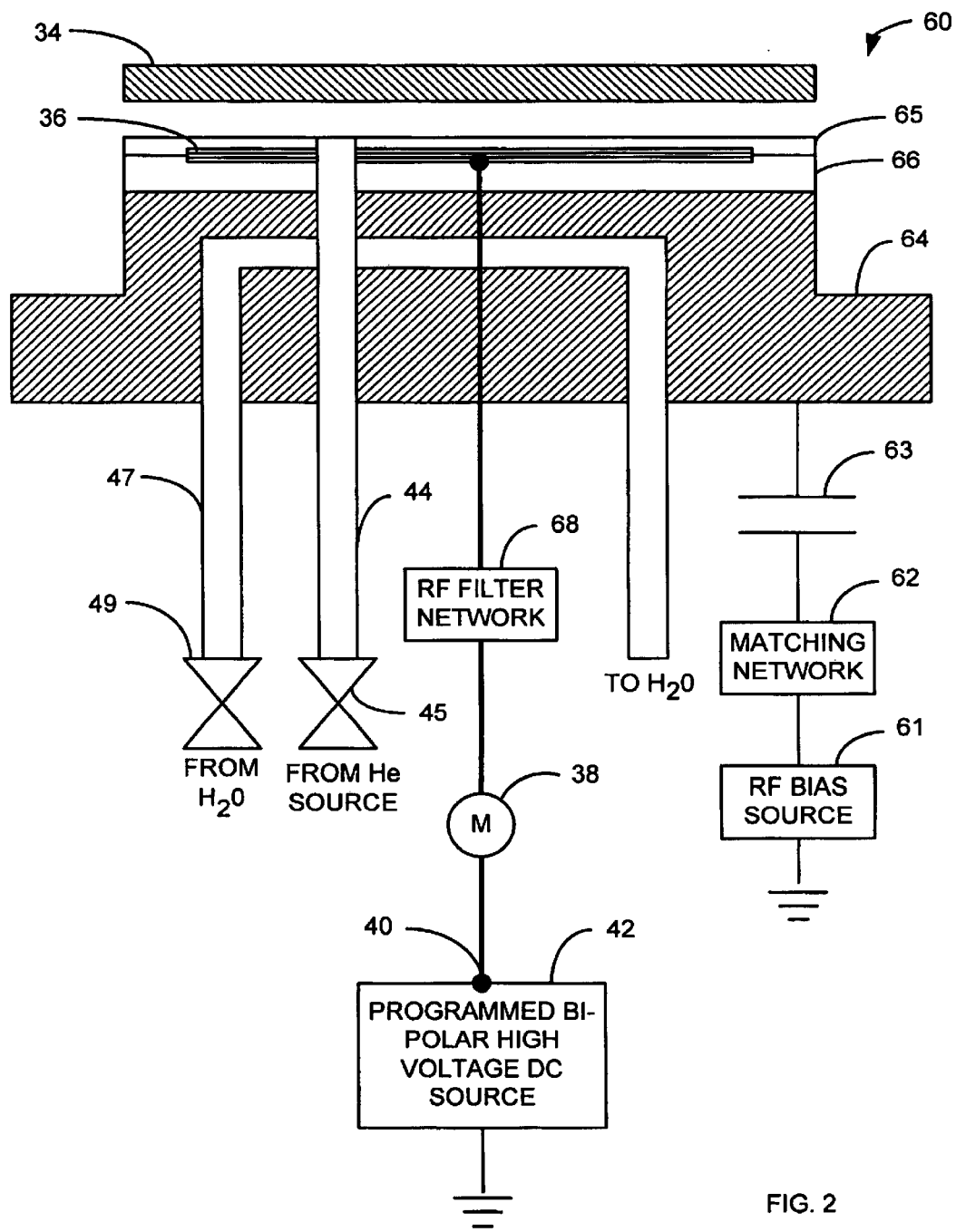
FIG. 2 is an exploded view of a monopolar ESC with a workpiece.

Referring to FIG. 2 there is shown an exploded view of an illustrative monopolar electrostatic chuck operatively coupled to workpiece 34. During the chucking process, i.e. workpiece clamping process, and the dechucking process, i.e. workpiece declamping process, a sensor 38 monitors an ESC electrical property between electrode 36 and voltage source 42. By way of example and not of limitation, the ESC electrical property monitored by sensor 38 is the current between electrode 36 and voltage source 42. Thus in the example, the sensor 38 is an ammeter configured to measure current. Additionally, the sensor 38 may also measure other ESC electrical properties such as voltage, resistance, capacitance, inductance, impedance and any other such electrical property. The sensor 38 is disposed between electrode 36 and terminal 40 of source 42. As described below, a computer system is configured to receive the output from sensor 38 and controls the chucking and dechucking forces applied to ESC 30.

Referring back to FIG. 1, the temperature of workpiece 34 is controlled by supplying helium gas from a suitable source (not shown) via conduit 44 and valve 45 through ESC 30 to the workpiece back face, i.e., to the face of the workpiece not exposed to the ions in the processing chamber 10, and by supplying a coolant liquid to ESC 30 via conduits 47 and valve 49 from a suitable source (not shown). The pressure of the gas applied to the back face of workpiece 34 is sufficient to push workpiece 34 off ESC 30 if there is little or no sticking force between the ESC 30 and the workpiece 34. The helium gas cools workpiece 34 by transferring heat, between the workpiece and ESC 30. ESC 30 acts as a relatively cool heat sink because of the liquid coolant flowing to it via conduit 47.

The back face of workpiece 34 abuts a flat planar face of ESC 30, except in portions of the chuck face that are grooved. ESC 30 applies a force to the workpiece 34 so the exposed surface of the workpiece is flat and lies in a plane substantially parallel to the ESC flat planar face. ESC 30 is also constructed so the helium gas contacts a substantial portion of the back face of workpiece 34.

During operation, the workpiece 34 is clamped or chucked to the ESC 30 by the capacitive coupling generated from source 42. Since the charge stored on the illustrative workpiece 34 is sufficiently large to prevent the workpiece from being removed from ESC 30, a reverse polarity voltage is applied to the ESC 30 to remove the residual charge that remains stored on the workpiece 34. Thus, the reverse polarity voltage is generated by power source 42 and applied for a particular period of time to cancel the residual charge on the workpiece 34. The process of removing the workpiece 34 from the ESC is referred to as "dechucking". For purposes of this disclosure the term "dechucking parameter" refers to the application of a reverse polarity voltage for a period of time.

The computer system 50 includes microprocessor 52, random access memory (RAM) 54 and read only memory (ROM) 56, controls the amplitude of a time varying voltage derived by source 42, opening and closing of valves 21, 45 and 49, as well as turning on and turning off of RF source 26 and the reactive impedances of matching network 28. Microprocessor 52 responds to a program stored in ROM 56, to signal values stored in RAM 54, and to the amplitude of the current in the pulse sensed by sensor 38 to control valves 21, 45, 49 high voltage source 42 and RF source 26. In addition, microprocessor 52 responds to values of (1) output power of source 26 and (2) power reflected back to the source, as derived from suitable transducers (not shown), to control the reactances of matching network 28.

Furthermore, the computer system 50 is configured to either generate and/or store a correlation between the ESC resistance and the dechucking parameters as described below. In order to determine the dechucking parameters for a particular ESC, the microprocessor 52 is configured to receive ESC electrical property measurements. Additionally, the computer system is configured to analyze ESC electrical property measurements so that a fitting parameter, $R_0$, unique to each ESC can be determined by the computer system 50 as described in further detail below. Preferably, the computer system 50 is operatively coupled to a user interface 58 that is configured to received inputs from a tool operator. The user interface 58 may include an $R_0$ input 59 that calculates the fitting parameter, $R_0$, automatically. The automated method for calculating the fitting parameter $R_0$ is described in further detail below. It shall be appreciated by those of ordinary skill in the art that the user interface 58 may also be designed to permit the operator to manually input an $R_0$ and thereby override the automated sequence for calculating the fitting parameter $R_0$. Finally, the computer system 50 is configured to calculate an approximate dechucking parameter for the new ESC using the fitting parameter, $R_0$, as described below.

Referring back to FIG. 2, there is shown an illustrative monopolar ESC 60 housed by the processing chamber 10 of FIG. 1. The ESC 60 is connected to the high voltage terminal 40 of a programmed DC source 42. During initial processing of workpiece 34 in chamber 10, the voltage at terminal 40 can reach several thousand volts. For the ESC 60, the voltage source 42 may be constructed so terminal 40 is at either a negative or positive voltage relative to the voltage at ground. Additionally, a radio frequency (RF) bias voltage is supplied to chuck 60 for ion energy control. To this end, RF source 61 is connected via matching network 62 and series DC blocking capacitor 63 to metal base 64 of ESC 60. The AC bias voltage causes workpiece 34 to become charged to a negative DC voltage because the highly mobile plasma electrons are attracted to the ESC to a much greater extent than the low mobility heavy plasma ions.

The front of electrode 36, i.e. the face of the plate closest to workpiece 34, is covered by an electrically resistive material 65, preferably formed as a layer completely covering the plate 36 front face. The remainder of plate 36 is surrounded by insulating layer 66, preferably made of a ceramic material. Insulating layer 66 is bonded to metal base 64. The temperature of metal base 64 is controlled by flowing a heating/cooling fluid through channel 47 in the metal base 64.

After workpiece 34 has been placed on resistive layer 65, DC voltage source 42 is turned on to a non-zero value, typically in the range of a few hundred to a few thousand volts. Heat transfer gas is then supplied via conduit 44 to the gaps between workpiece 34 and resistive layer 65.

In operation, after programmable DC power supply 42 is engaged, charge flows to the electrode 36 through ammeter 38 and RF filter network 68. After traveling through electrode 36, the charge proceeds through the resistive layer 65 and then through the contact between the resistive layer 65 to the workpiece 34. From workpiece 34, the charge then travels through the plasma to the chamber walls (not shown) and back to the ground terminal of programmable DC power supply 42. The flow of charge through the contact between the resistive layer 65 and the workpiece 34 comprises the flow of free charge and the flow of displacement charge. The flow of displacement charge between the resistive layer 65 and the workpiece 34 leaves a net charge of one polarity on the electrode 36 and resistive layer 65, and a net charge of the opposite polarity on workpiece 34. The attractive force between the two net charges of opposite polarity clamps the workpiece 34 to the ESC 60.

During the dechucking process, the application of a reverse polarity voltage from programmable DC voltage supply 42 speeds the reverse flow of current through resistive layer 65. In one embodiment, the reverse polarity voltage is applied at a specified magnitude for a variable period of time. In an alternative embodiment, the reverse polarity voltage is applied at a variable magnitude for a specified period of time.

Figure 3:
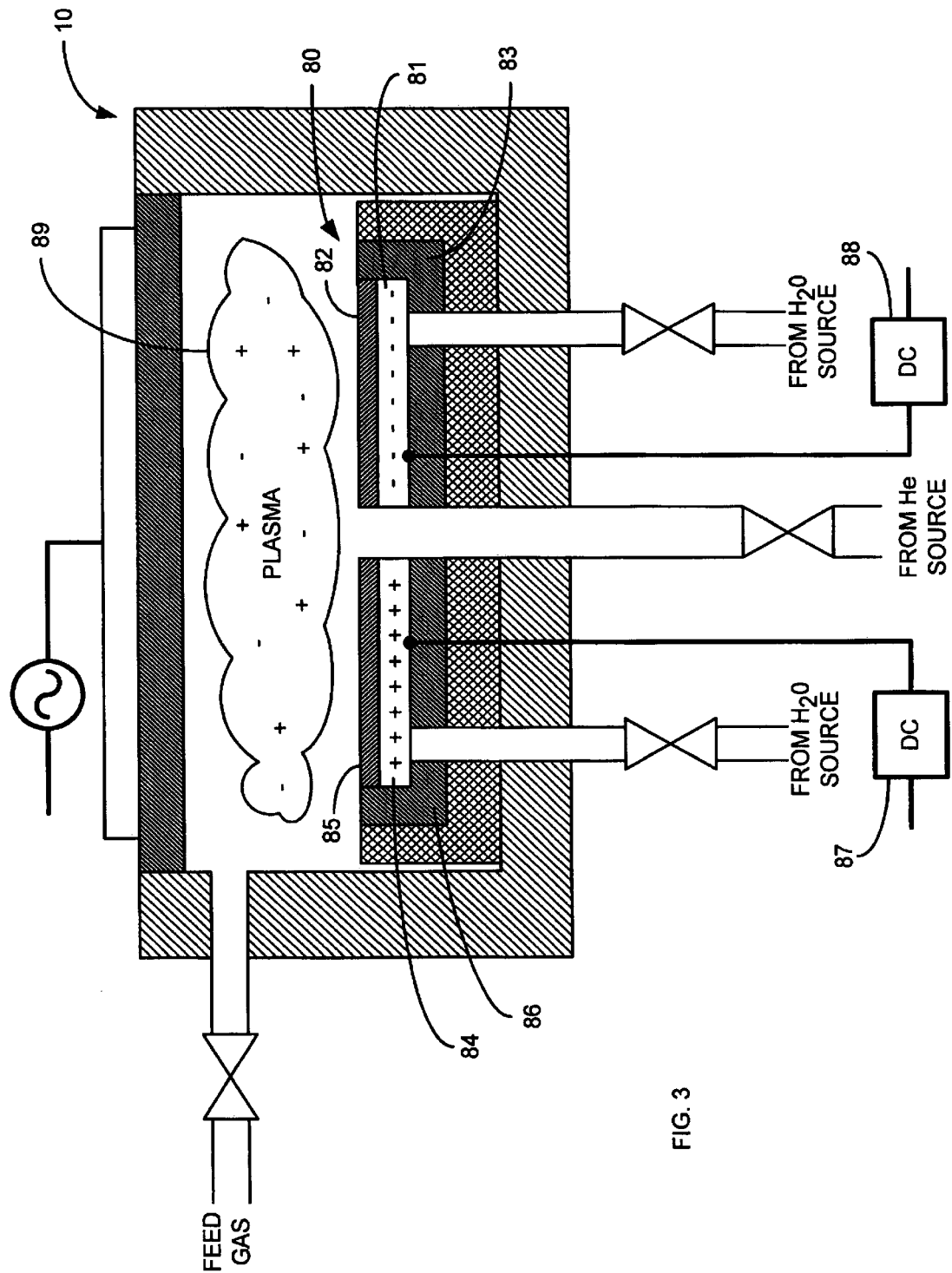
FIG. 3 is an exploded view of a bipolar ESC without a workpiece.

Referring to FIG. 3 there is shown an illustrative bipolar ESC 80 that may also be used in the chamber 10 of the illustrative plasma processor. The illustrative bipolar ESC 80 includes a first plate 81 embedded within dielectric layers 82 and 83, and a second plate 84 embedded within dielectric layers 85 and 86. When a chucking voltage is applied to the two electrodes via power supplies 87 and 88, a small current flows between the electrodes and through the workpiece (not shown) so that opposite charges accumulate on the surface of the two plates 81 and 84. These charges establish an electrostatic effect between the bipolar ESC 80 and the workpiece (not shown). It shall be appreciated by those skilled in the art that the power supplies are operatively coupled to the computer system 70 shown in FIG. 1.

2. Method for Calculating Dechucking Parameters

Figure 4:
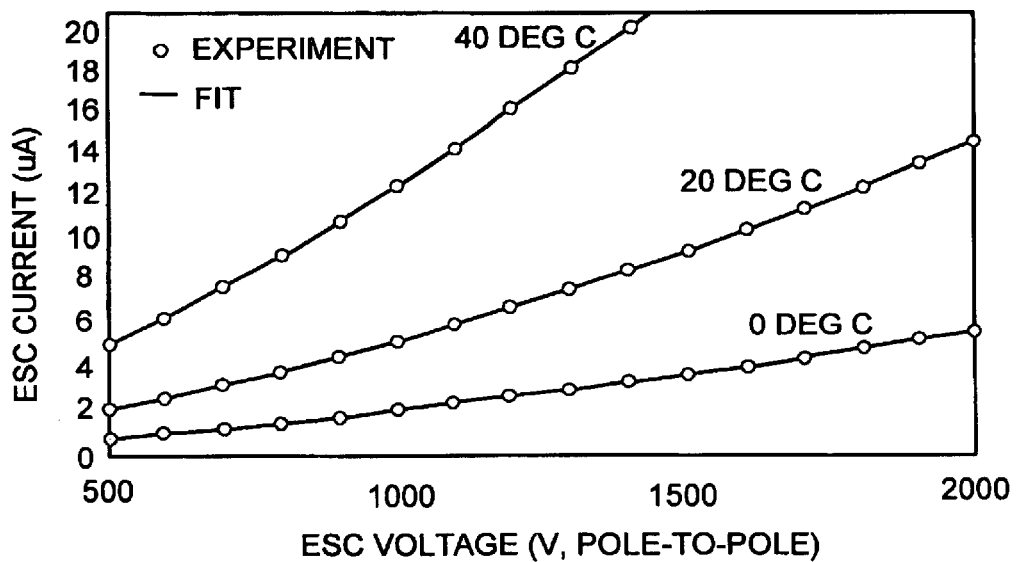
FIG. 4 is an illustrative plot of an illustrative ESC current plotted as a function of temperature and applied voltage.

The present invention provides a system and method for determining the dechucking parameters in a predictable manner. The dechucking parameters of reverse voltage magnitude and time for applying the reverse voltage vary as a function of the ESC electrical properties. Referring to FIG. 4 there is shown a plot of how the applied ESC voltage affects the ESC current, and how temperature affects the ESC current. As shown in FIG. 4, the ESC operates in a highly predictable manner.

Figure 5:
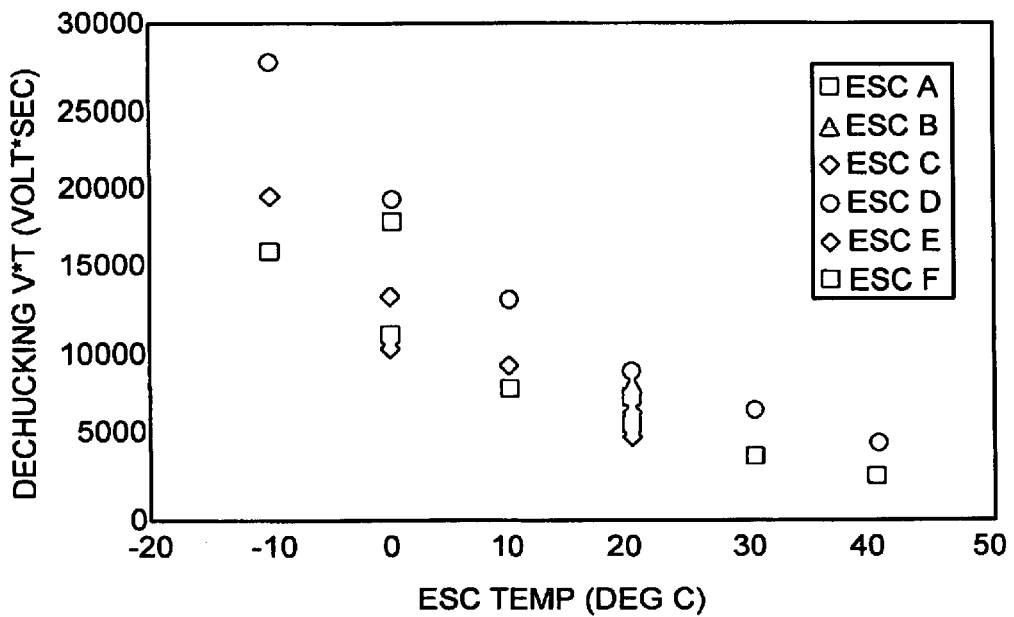
FIG. 5 is an illustrative plot of the dechucking parameters plotted as a function of ESC temperature.

Referring to FIG. 5, there is shown a plot of the dechucking parameters for six illustrative ESCs at various temperatures. The dechucking parameters vary for each of the six sample ESCs because of the significant differences in the electrical properties associated with each ESC. The plot in FIG. 5 illustrates that the dechucking parameters for a plurality of ESCs vary substantially.

In order to better understand the qualities of a single ESC, an equation used to model the electrical properties of a single ESC is described below. Referring back to FIG. 4, the plot of an illustrative ESC is generated using experimental results and by fitting the experimental results to an equation. More particularly, the dots in FIG. 4 are experimentally measured current values at various operative voltages and temperatures. The lines in FIG. 4 are generated using a fitting routine that follows the Poole-Frenkel equation:

$$I(T, V) = \frac{V}{R_0}\exp\left[\left(-A + B\sqrt{V}\right)/(273 + T)\right] \qquad \text{eq. 1}$$

or, equivalently, $$R(T,V) = R_0 \exp[(A - B\sqrt{V})/(273+T)] \qquad \text{eq. 2}$$

where:

I is the steady-state total pole-to-pole current of a bipolar ESC with a low power plasma and no wafer.

V is the pole-to-pole ESC voltage.

T is the ESC temperature in Celsius units.

$R_0$ is a fitting parameter that varies between each ESC and is a function of the material properties of the ESC, e.g. the particular dopants associated with the ESC. The $R_0$ fitting parameter varies from 400 Ω to 700 Ω for the illustrative plot.

A and B are determined empirically and are 3900 and 6.5, respectively, and are related to the material properties and geometry of the ESC.

It shall be appreciated by those skilled in the art having the benefit of this disclosure that the Poole-Frenkel equation can be used to reliably interpolate and extrapolate between the experimental points in FIG. 4.

Figure 6:
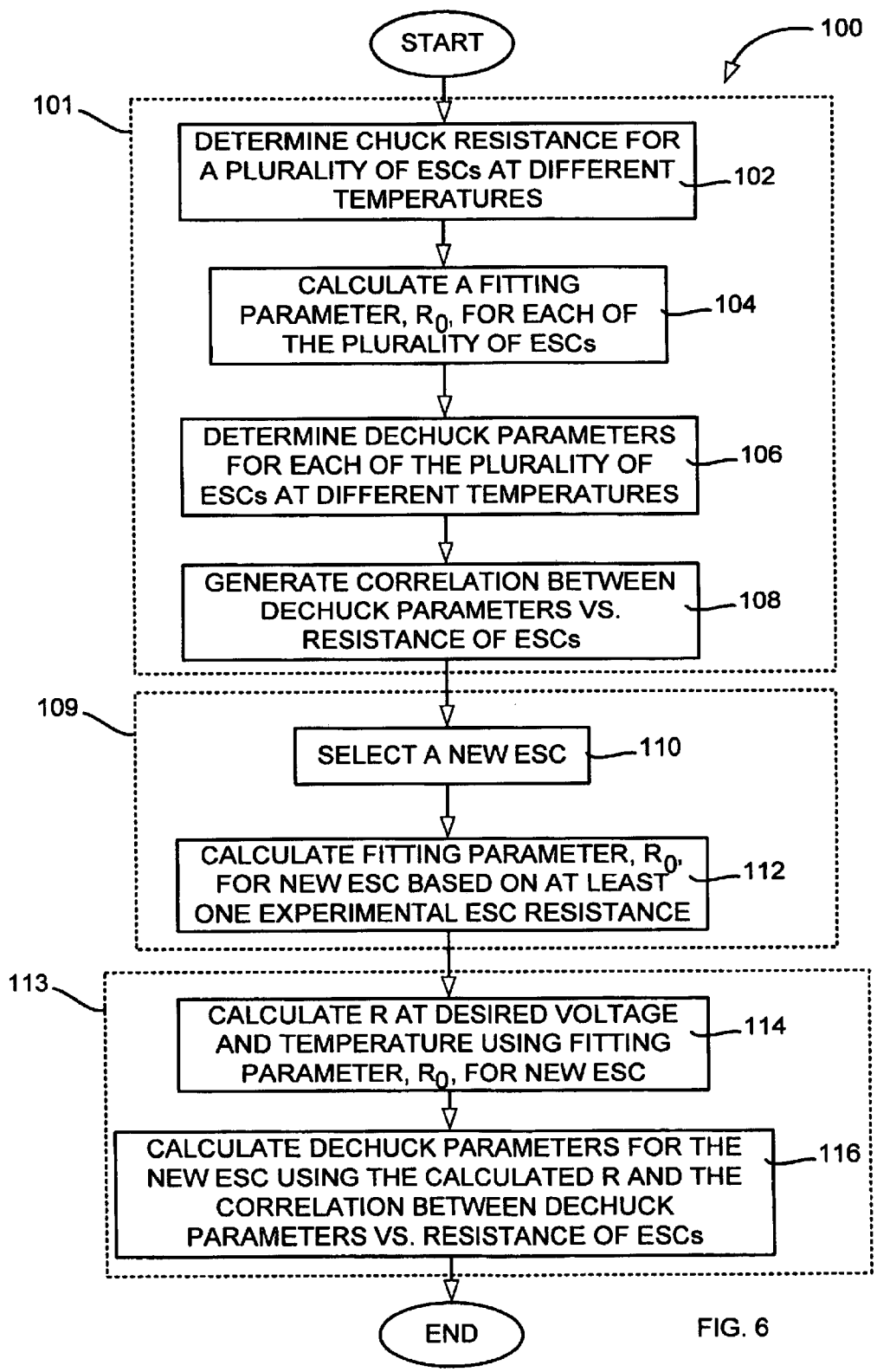
FIG. 6 is a flowchart for the method of determining dechucking parameters

Referring to FIG. 6 there is shown a flowchart of the method for determining dechucking parameters. As an overview, the method for determining dechucking parameters for an ESC comprises three steps. The first step comprises generating a correlation between an ESC electrical property, e.g. ESC resistance, and the dechucking parameters, as described in process block 101 which includes process blocks 102 through 108. The second step comprises performing a single experimental test on a new ESC to calculate a fitting parameter specific to the new ESC, as described in process block 109 which includes process blocks 110 and 112. The third step includes using the correlation and the fitting parameter to predict the dechucking parameters for the new ESC as described in process block 113 which includes process blocks 114 and 116.

The first step provides for the generation of a correlation between ESC electrical property such as ESC resistance and dechucking parameter is initiated at process block 102. At process block 102, the ESC electrical property of resistance is measured for a plurality of ESCs at a plurality of different temperatures. The method for measuring the ESC electrical property of resistance is described in further detail below. The method then proceeds to process block 104.

At process block 104, fitting parameters A, B and $R_0$ are calculated for each of the plurality of ESCs. The fitting parameters A and B are associated with the geometry, material and electrical properties for a "batch" of ESCs. A batch of ESCs includes a plurality ESCs that are typically manufactured by a single manufacturer and have similar geometric, material and electrical properties. The fitting parameter $R_0$ is associated with the unique electrical properties for each ESC. In the illustrative example, the process of calculating the fitting parameter A, B and $R_0$ requires conducting a plurality of experimental tests that measure the ESC electrical property of current at a plurality of operating temperatures and operating voltages. By way of example, the $R_0$ values for ESCs identified in FIG. 5 is provided in Table 1 below. The method then proceeds to process 106.

TABLE 1

| ESC Module | $R_0$ Value (Ω) |
|---|---|
| ESC A | 632 |
| ESC B | 654 |
| ESC C | 384 |
| ESC D | 668 |
| ESC E | 522 |
| ESC F | 416 |

At process block 106, the dechucking parameters, i.e. reverse voltage and time are measured for each of the plurality of ESCs. The method for determining the dechucking parameter may vary. In the preferred embodiment, the method for determining the dechucking parameters employs the current spike method described in further detail below. The method then proceeds to process block 108.

Figure 7:
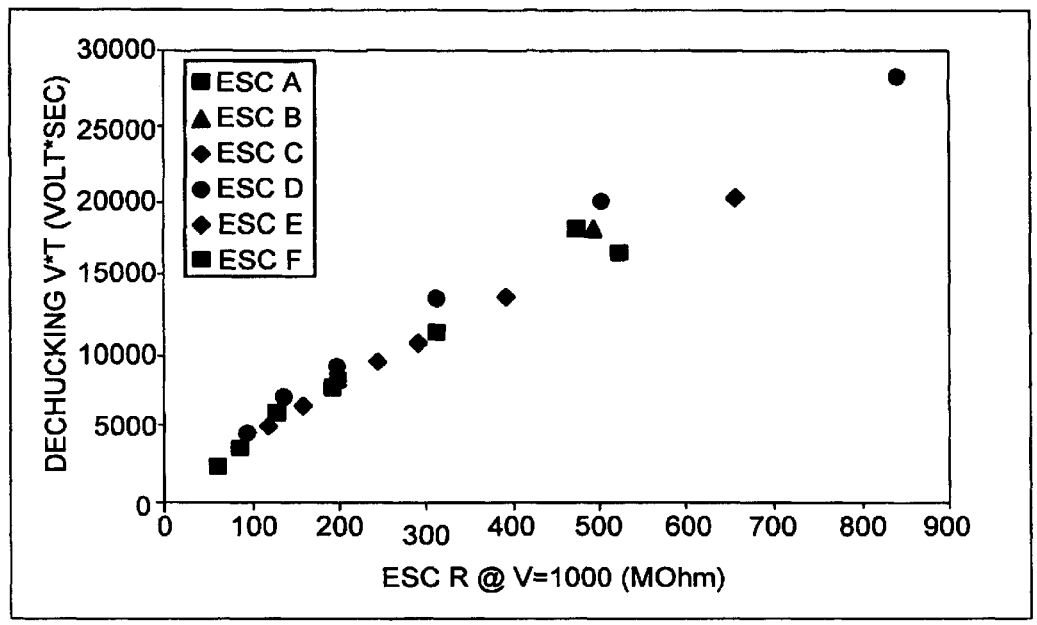
FIG. 7 is an illustrative plot of dechucking parameters plotted as a function of ESC resistance at 1,000 volts.
Figure 8:
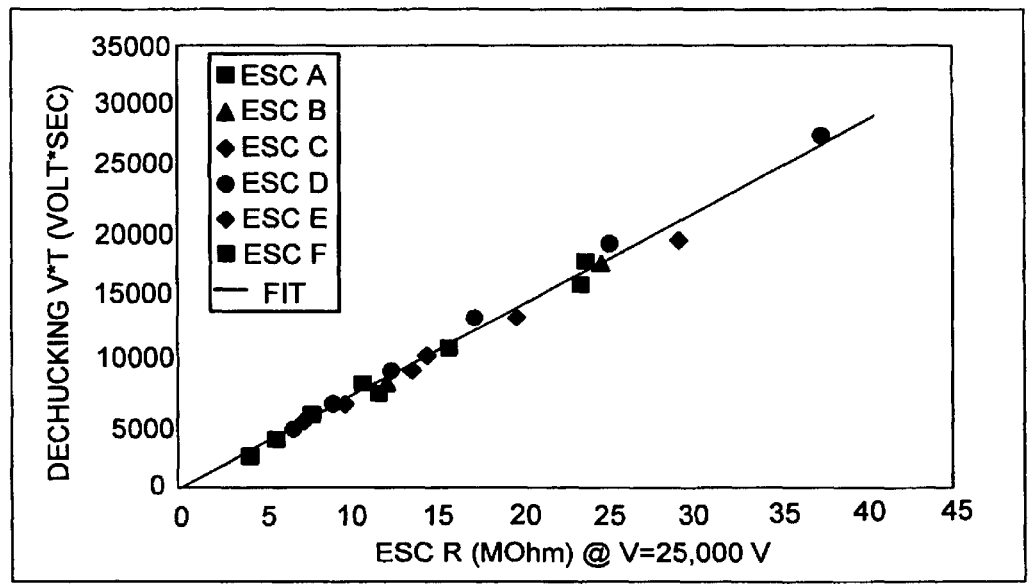
FIG. 8 is an illustrative plot of dechucking parameters plotted as a function of ESC resistance extrapolated to 25,000 volts.

At process block 108, a correlation between the dechucking parameters determined from block 106 and the ESC resistance measured at block 102 is generated. The correlation is generated so that a linear fit is established between the dechucking parameters and the ESC resistance. By way of example and not of limitation, the linear fit can be generated using the well known least squares statistical method. In FIG. 7 and FIG. 8 there are shown illustrative examples of the correlation between the ESC resistance and the dechucking parameters for the plurality of ESCs in FIG. 5.

Referring to FIG. 7, there is shown an illustrative plot of dechucking parameters plotted as a function of the ESC electrical property of resistance at 1,000 volts. The plot illustrates the relatively linear characteristics between the ESC electrical property of resistance and the dechucking parameters. The linear fit between the ESC resistance and the dechucking parameters can be improved by selecting a "fitting" voltage which generates a better fit between the ESC resistance and the dechucking parameters.

Referring to FIG. 8, there is shown an illustrative plot of dechucking parameters plotted with a "fitting" voltage of 25,000 volts. It shall be appreciated by those skilled in the art, that the processing chamber does not operate using an operating voltage of 25,000 volts. However, the fitting voltage of 25,000 volts generates a better linear fit than the operating voltage of 1,000 volts shown in FIG. 7.

The second step in the method for determining the dechucking parameters for the new ESC comprises selecting a new ESC, a temperature and a voltage, and then performing a single experimental test to calculate a fitting parameter, $R_0$, specific to the new ESC. The second step is described more carefully by process blocks 110 and 112.

At process block 110 the new ESC is selected. At least one operating temperature and operating voltage is selected for the experimental test that measures an ESC electrical property such as current or resistance of the new ESC. By way of example, the temperature is selected at a mid-point for the operating temperature range, and the selected voltage selected at a mid-point for the operating voltage range. The method then proceeds to process block 112.

At process block 112, an experimental test is conducted on the newly selected ESC at the selected temperature and voltage. The experimental test includes measuring the ESC electrical property of current passing through the ESC and then calculating the ESC resistance. The ESC resistance for the new ESC is then applied to the Poole-Frenkel equation to calculate the fitting parameter, $R_0$, that is specific to the new ESC. The A and B fitting parameters are derived from the calculations conducted at block 104 described above. The selected operating voltage and selected operating temperature are also used to calculate $R_0$. Recall the fitting parameter $R_0$ provides a fitting parameter that is specific to each ESC.

The third step in determining the dechucking parameters of the new ESC comprises applying fitting parameter, $R_0$, generated at process block 112, and the correlation, generated at process block 108. At process block 114, the ESC electrical property of resistance is calculated using a fitting voltage at a desired operating temperature for the new ESC. Applying fitting parameter $R_0$ for the new ESC from block 112, the A and B parameters calculated in block 104, the fitting voltage, and the desired operating temperature to the Poole-Frenkel equation, an ESC resistance is calculated. The ESC resistance is modified by either a modified temperature or a modified voltage. The method then proceeds to process block 116.

At process block 116, the newly calculated ESC electrical property of resistance is applied to the correlation generated at block 108 to determine the dechucking parameters for the new ESC. As an illustrative example, the ESC electrical property of resistance is identified on the x-axis of FIG. 8, and the corresponding dechucking parameters on the y-axis is displayed as the product of the applied reverse voltage multiplied and the time period the reverse voltage is applied.

In operation, a discrete reverse polarity voltage magnitude is necessary and a discrete time period for applying the voltage is determined from the product V*t that represents the dechucking parameter. In operation, the discrete time period used to apply the reverse polarity voltage is affected by the operating limitations of the processing chamber. Therefore, in one illustrative embodiment, the dechucking parameter generated by the correlation from block 108 is divided by a selected reverse polarity voltage to determine the time period to apply the reverse polarity voltage.

3. Measuring the ESC Electrical Property of Resistance

In order to generate the correlation between an electrical property and the dechucking parameters described above, an electrical property must be selected and measured. The ESC electrical property that is measured must be measured reliably. The illustrative ESC electrical property that is measured or calculated is ESC resistance. The ESC resistance is based on measurements that are obtained in situ. The system for measuring the ESC resistance includes the processing chamber configured to generate a plasma and adapted to receive a workpiece described above in FIG. 1 through FIG. 3.

The method for measuring the ESC resistance provides for the measuring of current for the ESC and determining the ESC resistance based on the measured ESC current. Alternatively, ESC resistance may be measured in a test chamber and using a conductive material placed on the ESC. The in situ system and method for measuring ESC resistance is more efficient than the alternative. Other ESC electrical properties may also be measured and include ESC current, ESC impedance, and ESC capacitance.

Referring back to FIG. 3 there is shown one in situ system for measuring the resistance of the bipolar ESC 80. In the efficient in situ system used for measuring ESC resistance, there is no workpiece or other conductive material placed on the ESC. An ammeter (not shown) measures current that is conducted by the ESC. The measured current is then converted to a resistance based on the operating voltage, i.e. $R=V/I$.

Figure 9:
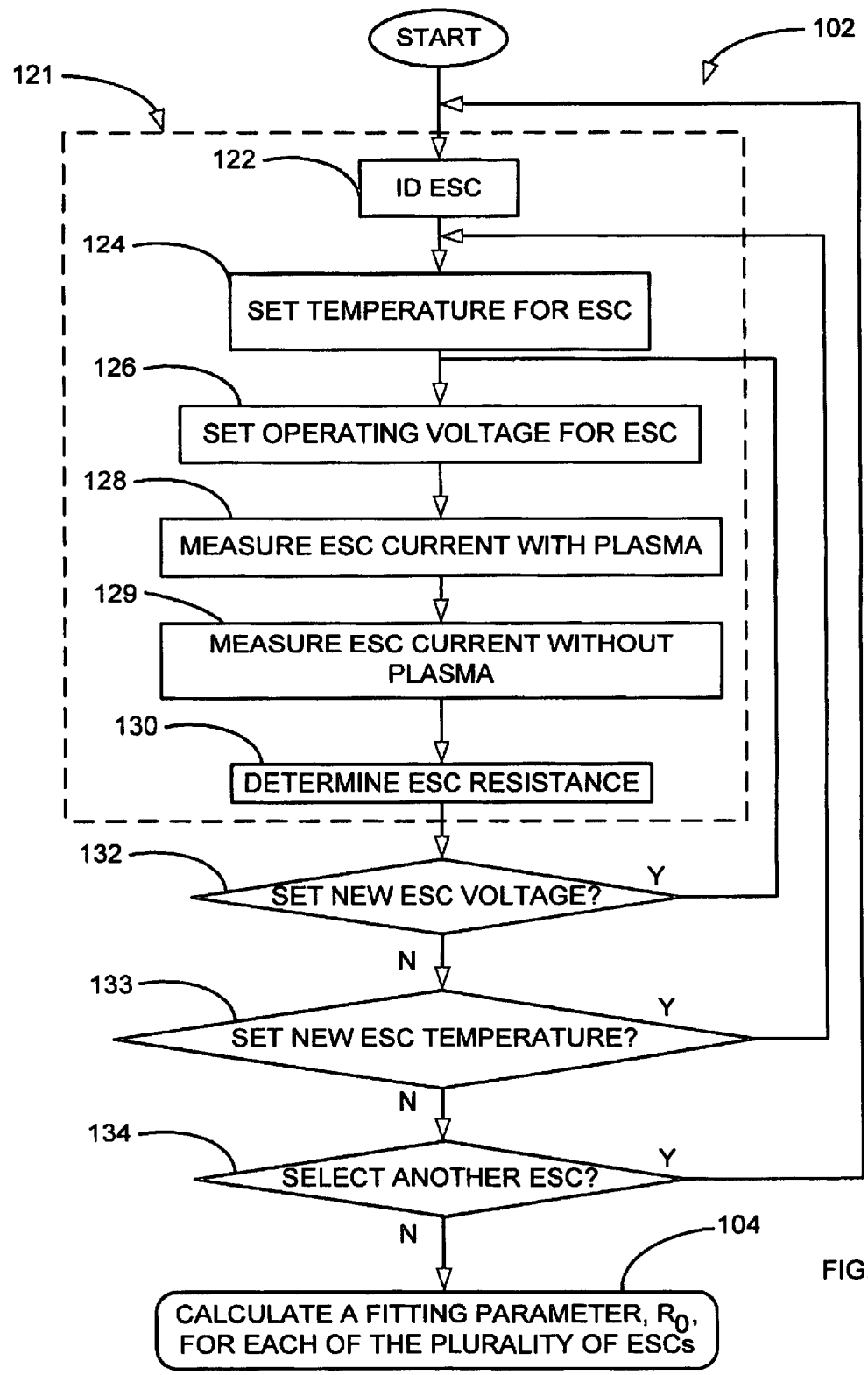
FIG. 9 is a flowchart of a method for determining chuck resistance for a plurality of ESCs at different temperatures.

Referring to FIG. 9, there is shown an efficient method 102 for measuring the ESC electrical property of resistance for a plurality of ESCs at a plurality of temperatures and a plurality of operating voltages. The efficient method provides a reliable method of determining the ESC resistance. More particularly, the process blocks within block 121 illustrates the method for conducting a single ESC resistance measurement at a single operating temperature and a single operating voltage.

The first process conducted in measuring the ESC electrical property of resistance is identifying the ESC as shown in process block 122, and then placing the identified ESC in the processing chamber 10 of FIG. 1. During the course of performing the ESC current measurements, a workpiece is NOT placed on the ESC. It shall be appreciated by those skilled in the art that either a monopolar or bipolar ESC may be analyzed. The method then proceeds to process 124.

At block 124, the operating temperature at which the ESC electrical property of resistance is measured is selected and input into the user interface 58 shown in FIG. 1. At block 126, the operating voltage for the ESC is selected and input into the user interface 58. The method then proceeds to process 128.

At block 128, the plasma is activated in the process chamber 10. The plasma acts as a conductive element that communicates charge from the ESC. Referring back to FIG. 3, a voltage is applied to first plate 81 and second plate 84 such that a current flows between the electrodes through the plasma 89. The current is measured by sensor 38 which is an ammeter and is communicated to computer system 50 as shown in FIG. 1. The method then proceeds to process 129.

At block 129 the plasma is turned off and the ESC current is measured again by a sensor. The current is measured without the plasma to identify the electrical current communicated in a vacuum through the ESC. At times little or no current is transferred by the ESC when there is little or no plasma in the chamber 10. The method then proceeds to process 130.

At block 130 the ESC resistance is determined by using the well known equation $V=IR$. The voltage is the applied ESC voltage from block 124. The current is the difference of the current measured with plasma on in block 128 minus the current measured with plasma off in block 129. It shall be appreciated by those skilled in the art that the current measured in block 129 may be negligible and thus the ESC resistance is dependent on the current measured in block 128. The method then proceeds to decision diamond 132.

At decision diamond 132, the decision to select a new ESC operating voltage is conducted. To generate the correlation between ESC electrical property of resistance and dechucking parameters, a plurality of ESC resistance measurements are taken at a plurality of operating voltages. Once the operating voltage is determined, the method returns to process block 126 to begin the process of performing the process steps for conducting the ESC resistance measurements. However, if only a single measurement of ESC resistance is taken, then the subsequent steps are not necessary. After the desired ESC resistance measurements are taken at various operating voltages, the method proceeds to decision diamond 133.

At decision diamond 133, the decision to select another ESC temperature is conducted. To generate the correlation between ESC electrical property of resistance and dechucking parameters, a plurality of ESC resistance measurements are taken at a plurality of operating temperatures. Once a new operating temperature is selected, then the method proceeds to process block 124 where the process of conducting ESC resistance measurements is reinitiated. After all the desired ESC resistance measurements are taken at a plurality of operating temperatures and at a plurality of operating voltages, the method proceeds to decision diamond 134.

At decision 134, the decision to select another ESC is conducted. To generate the correlation between ESC electrical property of resistance and dechucking parameters, a plurality of ESC resistance measurements are conducted for a plurality of ESCs at various operating voltages and various operating temperatures. Once the ESC measurements are taken, the method proceeds to process block 104 as described above.

4. Method for Measuring Dechucking Parameters

As previously discussed, dechucking parameters include the applied reverse polarity voltage, and the time period for applying the reverse polarity voltage. For purposes of this patent, the dechucking parameters are commonly referred to as the product of the applied reverse polarity voltage and time. The dechucking parameters are measured using the "current spike" method described below.

Referring back to FIG. 1, there is shown the system for measuring the dechucking parameters. The system provides for the dechucking of a workpiece 34 by applying a reverse voltage for a period of time. After dechucking parameters have been applied, then the workpiece 34 is lifted from the ESC 30. When the workpiece is lifted from ESC 30, a current is generated that is measured by sensor 38. The current is generated by the current pulse flowing through terminal 40 and electrode of ESC 30 while the workpiece 34 is removed from ESC 30. Microprocessor 52 responds to the current detected by sensor 38 by controlling the reverse polarity voltage applied to ESC 30 and the time period to apply the reverse polarity voltage.

Figure 10:
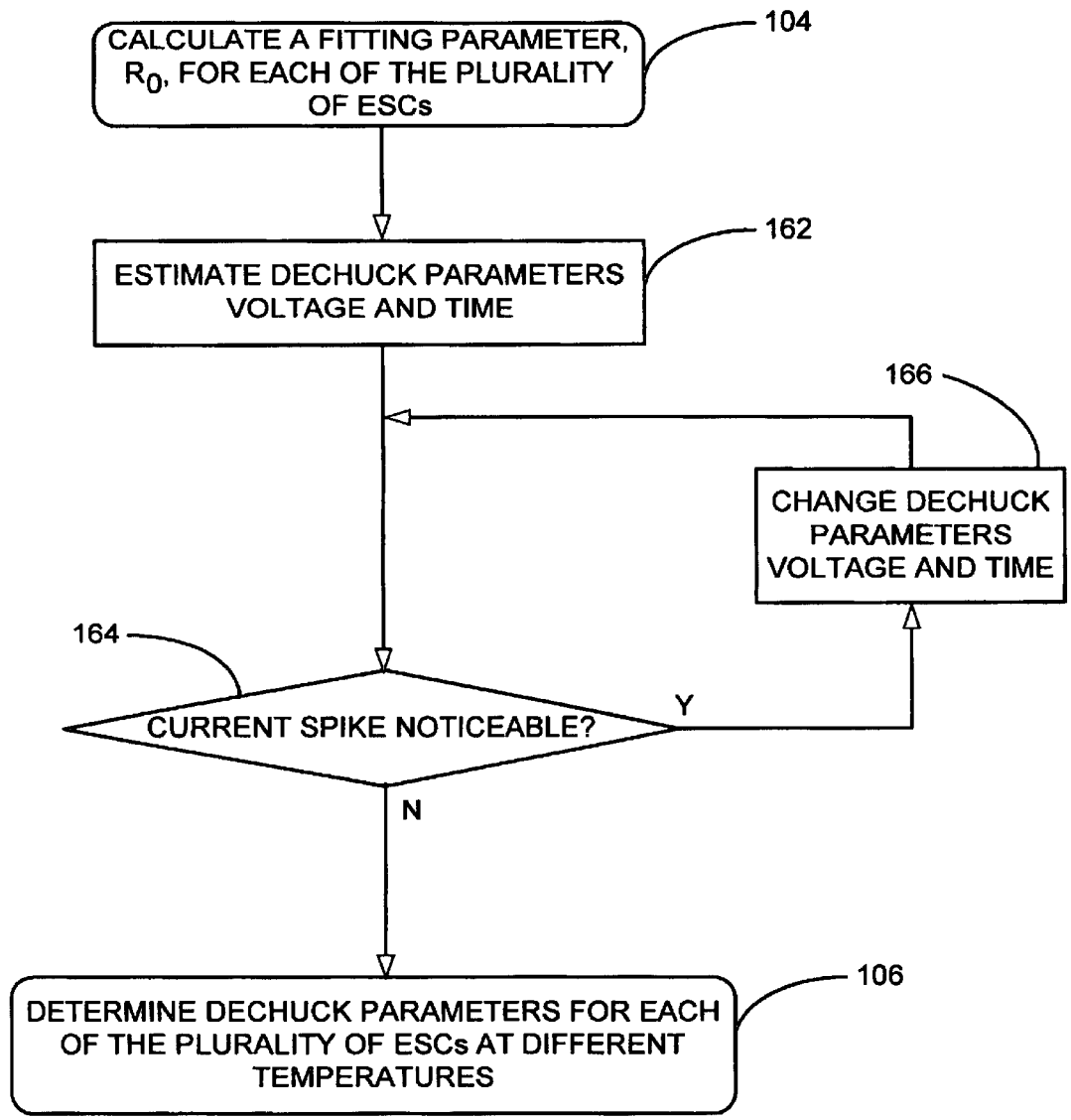
FIG. 10 is a flowchart of a method for experimentally determining optimal dechucking parameters.

Referring to FIG. 10, there is shown a method for measuring dechucking parameters. A plurality of different methods may be used for measuring the dechucking parameters. The present method is preferred due to its efficiency. The method is initiated after the process block 104 is completed and is initiated at process block 162.

At process block 162, there is shown the process of first estimating the dechucking parameters of reverse polarity voltage and time. As an illustrative example, the estimated dechucking parameters for initiating the dechucking sequence may be a default parameter which is used for all ESCs. The method then proceeds to decision diamond 164.

At decision diamond 164, it is determined if there is a current spike when the workpiece is lifted from the ESC. The current spike is generated if there is a current spike when the workpiece 34 is lifted from ESC 30 or ESC 80. If a current spike is detected the method proceeds to block 166. If there is no current spike detected, then the optimal dechucking parameters have been identified and the method proceeds to process block 106.

At block 166, the dechucking parameters are modified based on the type of current spike detected. Thus, if the current spike measured is a positive ESC current, then the dechucking parameters were too high and the modified dechucking parameters are lower than the previous dechucking parameters. On the other hand, if the current spike measured is a negative ESC current, then the dechucking parameters were too low and modified dechucking parameters are higher than the prior dechucking parameters. In operation, the dechucking parameters are modified until the magnitude of the current spike is minimized.

Figure 11:
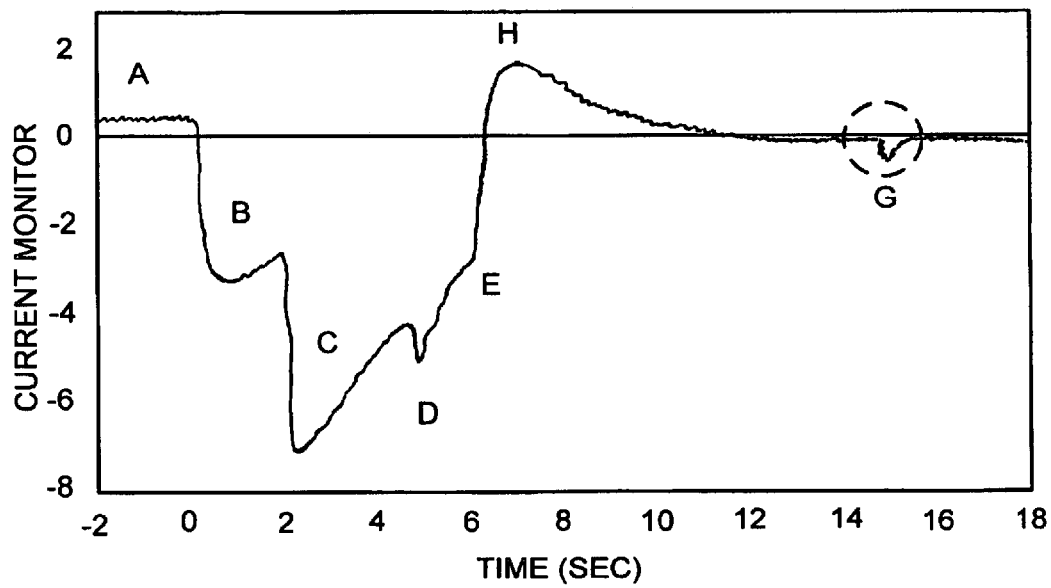
FIG. 11 is a plot of the current measured during the dechucking process.

Referring to FIG. 11, there is shown a plot of the measured ESC current during the dechucking process. The region A of FIG. 11 corresponds to the steady-state ESC current for a chucked workpiece. At region B, the ESC voltage is turned off and the current and the current magnitude starts to decay toward 0. At region C, the reverse polarity dechucking voltage is applied, which drives the ESC current to the maximum negative current magnitude. The negative current magnitude then begins to decay to a steady-state negative value while the reverse polarity dechucking voltage is applied. At region D, a spike is generated while the reverse polarity voltage is being applied. The region D spike corresponds to movement of the workpiece caused by the dechucking voltage countering the residual sticking force. At region E, the reverse polarity ESC voltage is turned off. Depending on the dechucking parameters, the current then goes to some value at region H that is either positive or negative and then begins to decay towards 0. At region G, the wafer is lifted and the current spike measurement occurs. The current spike measurement at region G indicates whether the applied dechucking parameters were too high or too low.

Figure 12:
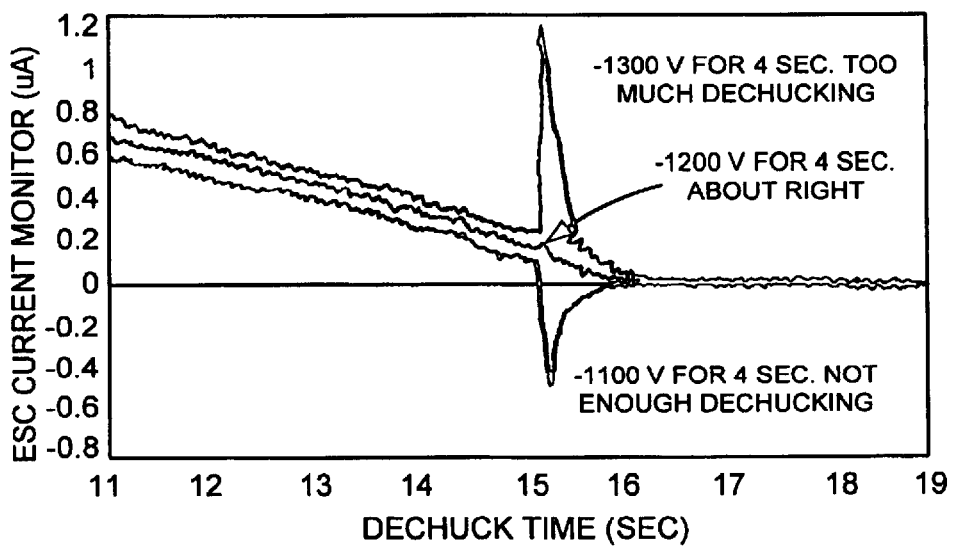
FIG. 12 is a plot of portion G of FIG. 11 that is used to determine the optimum dechucking parameters.

Referring to FIG. 12 there is shown a magnified illustrative plot of the current spike at region G. The illustrative plot shows the results associated with the dechucking parameters being too high, the dechucking parameters being too low, and the dechucking parameters being appropriate. The dechucking parameters are appropriate when the current spike is close to zero. By way of example, the current spike having a positive current resulted from the dechucking parameters being too high, i.e. either the voltage or time were too high. On the other hand, the current spike having a negative current resulted from the dechucking parameters being too low, i.e. either the voltage or time were too low. The appropriate dechucking parameters generate little or no current spike at region G.

While there have been described and illustrated specific embodiments of the invention, it will be clear that variations in the details of the embodiments specifically illustrated and described may be made without departing from the true spirit and scope of the invention as defined in the appended claims.

What is claimed is:

1. A system for dechucking a workpiece, comprising:
a first electrostatic chuck (ESC);
a sensor operatively coupled to said first ESC, said sensor configured to generate at least one sensor measurement of an ESC electrical property for said first ESC;
a computer system operatively coupled to said sensor,
said computer system having a correlation between said ESC electrical property measurement and a dechucking parameter for a plurality of ESCs,
said computer system configured to generate at least one dechucking parameter with said at least one sensor measurement and said correlation; and
a power supply operatively coupled to said computer system and said ESC, said power supply configured to receive said dechucking parameter from said computer system and apply said dechucking parameter to said first ESC.

2. The system of claim 1 wherein said plurality of ESCs are a batch of ESCs, said batch of ESCs having similar material properties and geometry.

3. The system of claim 2 wherein said first ESC has similar material properties and geometry to said batch of ESCs.

4. The system of claim 1 wherein said correlation is generated by obtaining said ESC electrical property measurement for each of said plurality of ESCs.

5. The system of claim 1 wherein said correlation is determined by measuring the dechucking parameters for each of said plurality of ESCs.

6. The system of claim 4 wherein said ESC electrical property measurement is generated at a particular temperature.

7. The system of claim 4 wherein said ESC electrical property measurement is generated at a particular voltage.

8. The system of claim 4 wherein said ESC electrical property measurement is generated at a particular voltage and a particular temperature.

9. The system of claim 1 wherein said dechucking parameter comprises a reverse polarity voltage.

10. The system of claim 1 wherein said dechucking parameter comprises a time period for applying a reverse polarity voltage.

11. The system of claim 1 wherein said sensor comprises an ammeter configured to measure current.

12. The system of claim 11 wherein said at least one sensor measurement is a current measurement.

13. The system of claim 1 wherein said ESC electrical property is an ESC current.

14. The system of claim 13 wherein said ESC current is related to an operating voltage and an operating temperature according to a relationship:

$$I(T, V) = \frac{V}{R_0} \exp\left[\left(-A + B\sqrt{V}\right)/(273 + T)\right]$$

where:

I is said ESC current,

T is said operating temperature in degrees Celsius,

V is said operating voltage, $R_0$ is a fitting parameter particular to said first ESC, and A and B are fitting parameters particular to a batch of ESCs.

15. The system of claim 14 wherein said dechucking parameter is determined at said operating temperature.

16. The system of claim 15 wherein said at least one sensor measurement for said first ESC is used to determine a value for said fitting parameter $R_0$.

17. The system of claim 1 wherein said ESC electrical property is an ESC resistance.

18. The system of claim 6 wherein said ESC resistance is related to an operating voltage and an operating temperature according to the following relationship:

$$R(T,V) = R_0 \exp[(A - B\sqrt{V})/(273+T)]$$

where:

I is said ESC current,

T is said operating temperature in degrees Celsius,

V is said operating voltage, $R_0$ is a fitting parameter particular to said first ESC, and A and B are fitting parameters particular to a batch of ESCs.

19. The system of claim 18 wherein said dechucking parameter is determined at said operating temperature.

20. The system of claim 19 wherein said at least one sensor measurement for said first ESC is used to determine a value for said fitting parameter $R_0$.

21. A system for dechucking a workpiece, comprising:

a first electrostatic chuck (ESC);

a sensor operatively coupled to said first ESC, said sensor configured to generate at least one ESC measurement of an ESC electrical property for said first ESC;

a computer system operatively coupled to said sensor,
   said computer system having a correlation stored with a computer memory from a batch of ESCs, said batch of ESCs having geometric similarities to said first ESC, said correlation comprising an ESC measurement of said ESC electrical property for each ESC from said batch of ESCs, and a dechucking parameter for each ESC from said batch ESCs, said dechucking parameter comprising a reverse polarity voltage magnitude that is applied to each ESC taken from said batch of ESCs, said computer system configured to generate at least one dechucking parameter for said first ESC with said correlation and said at least one ESC measurement associated with said first ESC; and a power supply operatively coupled to said computer system and said ESC, said power supply configured receive said dechucking parameters from said computer system and apply said dechucking parameter to said first ESC.

22. The system of claim 21 wherein said ESC electrical property measurement is generated at a particular temperature.

23. The system of claim 21 wherein said ESC electrical property measurement is generated at a particular voltage.

24. The system of claim 21 wherein said ESC electrical property measurement is generated at a particular voltage and a particular temperature.

25. The system of claim 21 wherein said ESC electrical property is an ESC current.

26. The system of claim 25 wherein said ESC current is related to an operating voltage and an operating temperature according to an equation:

$$I(T,V) = \frac{V}{R_0} \exp[(-A + B\sqrt{V})/(273+T)]$$

where:

I is said ESC current,

T is said operating temperature in degrees Celsius,

V is said operating voltage, $R_0$ is a fitting parameter particular to said first ESC, and A and B are fitting parameters particular to a batch of ESCs.

27. The system of claim 26 wherein said at least one sensor measurement for said first ESC is used to determine a value for said fitting parameter $R_0$.

28. The system of claim 21 wherein said ESC electrical property is an ESC resistance.

29. The system of claim 28 wherein said ESC resistance is related to an operating voltage and an operating temperature according to an equation:

$$R(T,V) = R_0 \exp[(A - B\sqrt{V})/(273+T)]$$

where:

I is said ESC current,

T is said operating temperature in degrees Celsius,

V is said operating voltage, $R_0$ is a fitting parameter particular to said first ESC, and A and B are fitting parameters particular to a batch of ESCs.

30. The system of claim 29 wherein said at least one sensor measurement for said first ESC is used to determine a value for said fitting parameter $R_0$.

31. A method for dechucking a workpiece from a first electrostatic chuck (ESC) within a processing chamber, comprising:

generating a correlation an electrical property of ESC and an appropriate dechucking parameter, said correlation, including, measuring at least one ESC electrical property for each ESC within said batch of ESCs, determining a dechucking parameter for each ESC within said batch of ESCs, said dechucking parameter comprising a reverse polarity voltage magnitude that is applied to release a workpiece from each ESC;

obtaining a single measurement for said first ESC; and determining at least one dechucking parameter for said first ESC with said single measurement and said correlation.

32. The method of claim 31 wherein said at least one ESC electrical property is an ESC current.

33. The method of claim 32 wherein said ESC current is related to an operating voltage and an operating temperature according to a relationship:

$$I(T,V) = \frac{V}{R_0} \exp[(-A + B\sqrt{V})/(273+T)]$$

where:

I is said ESC current,

T is said operating temperature in degrees Celsius,

V is said operating voltage, $R_0$ is a fitting parameter particular to each said ESC, and A and B are fitting parameters particular to said batch of ESCs.

34. The method of claim 33 wherein said determining said dechucking parameters for each ESC is conducted at a plurality of voltages.

35. The method of claim 33 wherein said determining said dechucking parameters for each ESC is conducted at a plurality of temperatures.

36. The method of claim 33 wherein said determining said dechucking parameters for each ESC is conducted at a plurality of voltages and temperature.

37. The method of claim 31 wherein said ESC electrical property is an ESC resistance.

38. The method of claim 37 wherein said ESC resistance is related to an operating voltage and an operating temperature according to the following relationship:

$$R(T,V)=R_0 \exp[(A-B\sqrt{V})/(273+T)]$$

where:

I is said ESC current,

T is said operating temperature in degrees Celsius,

V is said operating voltage, $R_0$ is a fitting parameter particular to each said ESC, and A and B are fitting parameters particular to a batch of ESCs.

39. The method of claim 38 wherein said determining said dechucking parameters for each ESC is conducted at a plurality of voltages.

40. The method of claim 38 wherein said determining said dechucking parameters for each ESC is conducted at a plurality of temperatures.

41. The method of claim 38 wherein said determining said dechucking parameters for each ESC is conducted at a plurality of voltages and temperature.

42. A method for generating a correlation between a dechucking parameter and an electrostatic chuck (ESC) electrical property, comprising:

selecting a batch of ESCs, said batch of ESCs including a plurality of ESCs having similar material properties and geometry;

determining an ESC electrical property measurement for each of said ESCs from said batch;

determining a dechucking parameter for each of said ESCs, said dechucking parameter comprising a reverse voltage magnitude;

correlating said ESC electrical property with said dechucking parameter for each ESC drawn from said batch of ESCs.

43. The method of claim 42 further comprising selecting at least one operating temperature for each ESC prior to determining said ESC electrical property.

44. The method of claim 42 further comprising selecting at least one operating voltage for each ESC prior to determining said ESC electrical property.

45. The method of claim 43 further comprising selecting at least one operating voltage for each ESC prior to determining said ESC electrical property.

46. The method of claim 42 wherein said ESC electrical property measurement is an ESC resistance measurement.

47. The method of claim 42 wherein said ESC electrical property measurement is an ESC current measurement.

48. The method of claim 42 wherein said ESC electrical property measurement is an ESC voltage measurement.

49. The method of claim 42 wherein said ESC electrical property measurement is an ESC capacitance measurement.

50. The method of claim 42 wherein said ESC electrical property measurement is an ESC impedance measurement.

$$R(T,V)=R_0 \exp[(A-B\sqrt{V})/(273+T)]$$

where:

I is said ESC current,

T is said operating temperature in degrees Celsius,

V is said operating voltage, $R_0$ is a fitting parameter particular to said first ESC, and A and B are fitting parameters particular to a batch of ESCs having similar material properties and geometry as said first ESC.

51. A method for determining an electrostatic chuck (ESC) resistance, comprising:

providing a processing chamber configured to hold a plasma;

providing an ESC configured to be received by said processing chamber;

setting an operating temperature for said ESC;

setting an operating voltage for said ESC;

generating a plasma within said processing chamber;

applying said operating voltage to said ESC; and measuring an ESC current for said ESC with an ammeter operatively coupled to said ESC at said operating temperature; and calculating an ESC resistance with said measured ESC current and said ESC operating voltage.

52. The method of claim 51 wherein said ESC is a monopolar ESC.

53. The method of claim 51 wherein said ESC is a bipolar ESC.

54. The method of claim 51 wherein said ESC resistance is related said operating voltage and said operating temperature according to the following relationship:

$$R(T,V)=R_0 \exp[(A-B\sqrt{V})/(273+T)]$$

where:

I is said ESC current,

T is said operating temperature in degrees Celsius,

V is said operating voltage, $R_0$ is a fitting parameter particular to said ESC, and A and B are fitting parameters particular to a batch of ESCs having similar material properties and geometry as said ESC.

55. A method for determining a time period for applying a reverse voltage magnitude to release a workpiece from an electrostatic chuck (ESC), comprising:

generating a clamping force to clamp said workpiece to an electrostatic chuck;

estimating a first time period for applying a reverse voltage to cancel said clamping force;

lifting said workpiece from said ESC;

measuring a charge transfer from said workpiece during said lifting of said workpiece to said ESC with a meter; and modifying a time period for applying said reverse voltage magnitude if a current spike is detected by said meter.

56. The method of claim 55 further comprising repeating said modification until little or no said current spike is detected.

57. A method for determining a reverse voltage magnitude to release a workpiece from an electrostatic chuck (ESC), comprising:

generating a clamping force to clamp said workpiece to an electrostatic chuck;

estimating a first time period for applying said reverse voltage magnitude to cancel said clamping force;

lifting said workpiece from said ESC;

measuring a charge transfer from said workpiece during said lifting of said workpiece to said ESC with a meter; and modifying said reverse voltage magnitude if a current spike is detected by said meter.

58. The method of claim 57 further comprising repeating said modification until little or no said current spike is detected.

59. A method for determining a reverse voltage magnitude and time period for applying said reverse voltage magnitude to release a workpiece from an electrostatic chuck (ESC), comprising:

generating a clamping force to clamp said workpiece to an electrostatic chuck;

estimating a first time period for applying said reverse voltage magnitude to cancel said clamping force;

lifting said workpiece from said ESC;

measuring a charge transfer from said workpiece during said lifting of said workpiece to said ESC with a meter; and modifying said time period and said reverse voltage if a current spike is detected by said meter.

60. The method of claim 59 further comprising repeating said modification until little or no said current spike is detected.

* * * * *